United States Patent [19]

Yamaguchi et al.

[11] Patent Number: 4,751,710
[45] Date of Patent: Jun. 14, 1988

[54] SEMICONDUCTOR LASER DEVICE

[75] Inventors: Masayuki Yamaguchi; Ikuo Mito; Mitsuhiro Kitamura, all of Tokyo, Japan

[73] Assignee: NEC Corporation, Tokyo, Japan

[21] Appl. No.: 758,238

[22] Filed: Jul. 24, 1985

[30] Foreign Application Priority Data

Jul. 26, 1984 [JP] Japan ............................ 59-156116
Sep. 25, 1984 [JP] Japan ............................ 59-200208

[51] Int. Cl.4 ............................................. H01S 3/19
[52] U.S. Cl. .................................... 372/50; 372/44;
372/49; 372/96
[58] Field of Search ................. 372/43, 44, 49, 50,
372/96, 102

[56] References Cited

U.S. PATENT DOCUMENTS 4,573,158  2/1986  Utaka et al. ........................... 372/96
4,575,851  3/1986  Seki et al. .............................. 372/45
4,622,674  11/1986  Mito ..................................... 372/50

FOREIGN PATENT DOCUMENTS 0057692  4/1985  Japan ................................. 372/43
0066490  4/1985  Japan ................................. 372/43

OTHER PUBLICATIONS

Blum et al., "Monolithic Integrated Optical Circuits", Naval Research Reviews, vol. 28, No. 2, pp. 1–11, Feb. 1975.

Primary Examiner—James W. Davie
Assistant Examiner—Georgia Y. Epps
Attorney, Agent, or Firm—Sughrue, Mion, Zinn, Macpeak & Seas

[57] ABSTRACT

A tunable semiconductor laser device includes a laser region and a tuning region, with a highly reflective surface formed on the cleaved vertical end facet of the tuning region for providing a reflectivity of 50% or more. The laser and tuning regions are formed on a common semiconductor substrate with the laser region having an active layer formed over the substrate, an optical waveguide layer adjacent the active layer and an electrode for carrying a drive current to the active region. The tuning region, adjacent the laser region on the substrate includes an optical waveguide which extends from the optical waveguide of the laser region, and a tuning current carrying electrode for injecting a tuning current across the waveguide layer of the tuning region. The tuning current alters the refractive index of the waveguide layer interface which changes the phase of the tuning region. Changing the tuning current varies the laser wavelength. The highly reflective end facet assures continuous wavelength tuning. The laser device may be incorporated into an integrated optical local oscillator comprising the laser device, a photodiode, a branched optical waveguide including an input port for mixing the output of the laser device and the light from the input port before being received by the photodiode.

12 Claims, 4 Drawing Sheets

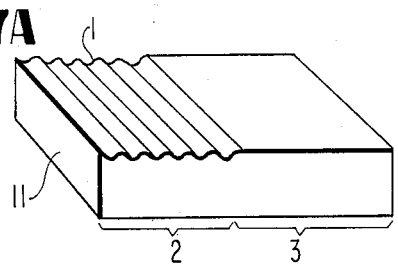
FIG 7A
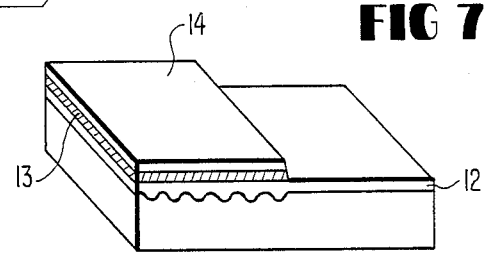
FIG 7B
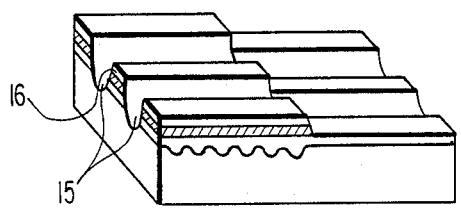
FIG 7C
FIG 7D
FIG 7E
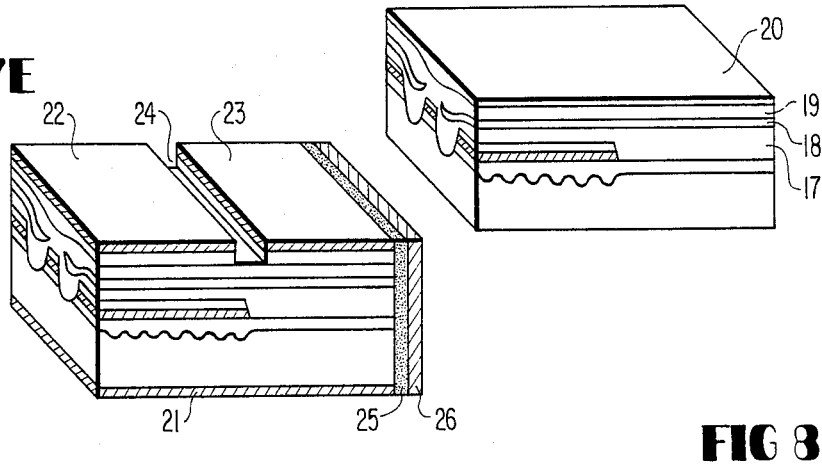
FIG 8
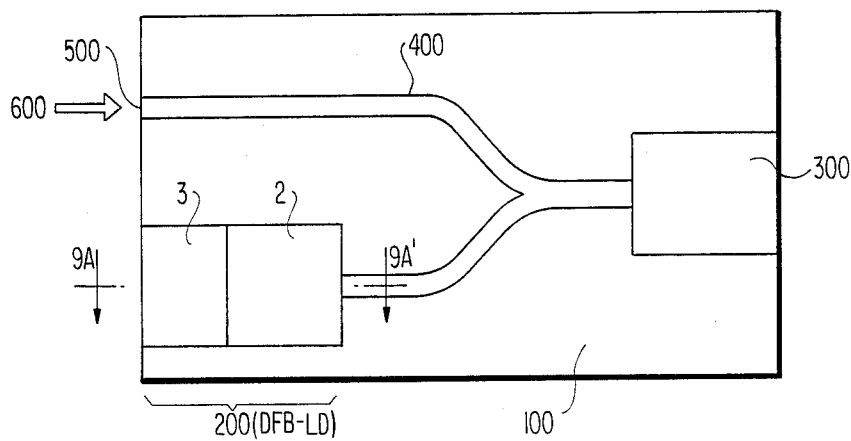

SEMICONDUCTOR LASER DEVICE

BACKGROUND OF THE INVENTION

The present invention relates to a wavelength-variable semiconductor laser and to an integrated optical device in which such a laser is built.

A distributed feedback semiconductor laser diode (DFB LD) having a diffraction grating built-in, because it oscillates in a single longitudinal mode (SLM), seems to promise effective application to long-distance large-capacity optical fiber communication and future systems of optical coherent transmission. In an optical heterodyne communication system, the local oscillator of light has to follow the light signal while maintaining a constant wavelength difference in order to provide beat signals. Therefore, an SLM laser for use as the local oscillator requires an ability to exercise tuning, in particular continuous fine tuning, of the oscillation wavelength.

Such wavelength-variable SLM semiconductor lasers include the facet phase-tunable DFB LD, as referred to by Kitamura et al., "Phase Tunable DFB-DC-PBH LD", 1984 NATIONAL CONVENTION (RECORD) of ELECTRONICS AND COMMUNICATION ENGINEERS OF JAPAN, Vol. 4, Paper No. 1024 (in Japanese).

FIG. 1 is a schematic diagram of this facet phase-tunable DFB LD, which consists of a laser region 2 in which a diffraction grating 1 is formed and a tuning region 3. The facet 4 of the tuning region 3 is formed by cleaving, and has a light reflectivity of about 30%. In this facet phase-tunable DFB LD, an electric current is injected into the tuning region 3 to alter the refractive index of this region, so that the light path length is equivalently varied to tune the phase of the light beam on the border between the laser region 2 and the tuning region 3 as the reflected light beam returns from the facet 4 and thereby to tune the oscillation wavelength.

The current injection into the tuning region 3 causes the refractive index of this region to vary due to the plasma effect. Accordingly, the phase of the light beam which enters the tuning region 3 from the laser region 2 is changed and returns reflected by the end face 4. This behavior is the same as what would take place if, in a DFB LD element wherein the tuning region 3 of FIG. 1 were absent and only a DFB region 2 were present, the position (the phase of the diffraction grating) in which the diffraction grating is cut off at the right end of the laser region 2 were varied. FIG. 2 shows a curve representing the wavelength-dependence of the oscillation threshold gain in this case. When the position in which the diffraction grating is cut off varies, the oscillation mode corresponding to that position shifts in the sequence of A→B→C→D→A. (See, for example, K. Utaka et al., "Effect of Mirror Facets on Lasing Characteristics of Distributed Feedback InGaAsP/InP Laser Diodes at 1.5 μm Range", IEEE JOURNAL OF QUANTUM ELECTRONICS, VOL. QE-20, No. 3, March 1984, pp. 236-245.) If a current is injected into the tuning region of a facet phase tunable laser to control the quantity of the phase shift of the light beam reflecting from the facet 4, the oscillation mode will shift on the oscillation threshold control curve in the sequence of A→B→C→D→A as indicated by the arrows in FIG. 2, so that continuous wavelength tuning can be achieved between B and C and between D and A. However, there also emerges between point A and point B, where a Bragg wavelength lies, a region where no oscillation mode exists at all (hereinafter referred to as a stopband). Therefore, in this facet phase tunable DFB LD, selective oscillation of either one of the two modes, i.e. one existing between A and D and the other between B and C, is possible by controlling the quantity of the phase shift in the tuning region 3. In this facet phase tunable DFB LD, however, the presence of the stopband makes impossible continuous wavelength tuning between A and B and, although fine tuning of the oscillation wavelength between A and D or B and C is possible, the finely tunable range is less than 1 Å, so that the application of such a DFB LD to the optical heterodyne system or the like is impossible.

SUMMARY OF THE INVENTION

An object of the present invention is to provide a semiconductor laser permitting continuous wavelength tuning.

According to the invention, there is provided a semiconductor laser device consisting of a laser region provided with a stratified structure having an active layer and a diffraction grating provided in the vicinity of said active layer, and a tuning region having an optical waveguide layer optically coupled to said laser region, wherein the light emitting end facet on said tuning region constitutes a high reflectivity structure having a light reflectivity of 50% or above.

BRIEF DESCRIPTION OF THE DRAWINGS

The present invention will be described in detail below with reference to the accompanying drawings, wherein

FIGS. 7A to 7E show an oblique view of the production process thereof;

FIG. 8 shows a plan of an integrated semiconductor laser device which is another preferred embodiment of the invention.

PRINCIPLE OF THE PRESENT INVENTION

Figure 1:
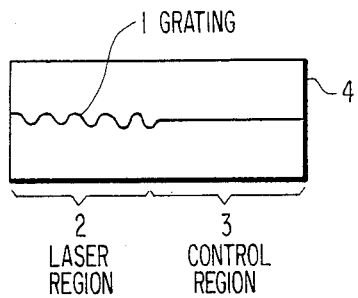
FIG. 1 is a schematic diagram of a conventional facet phase-tunable DFB LD.
Figure 2:
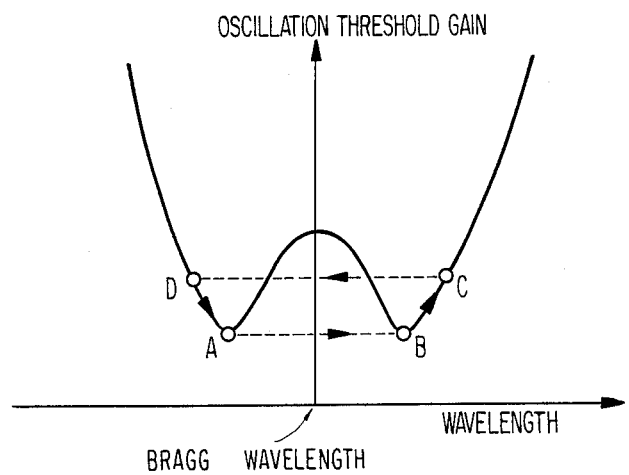
FIG. 2 is a chart showing the relationship between the oscillation threshold gain and the wavelength, wherein the wavelength variation by facet phase tuning is also indicated.
Figure 3:
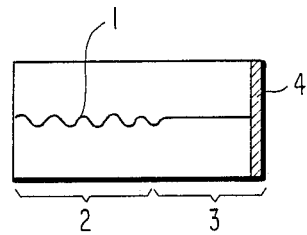
FIG. 3 is a schematic diagram of a single longitudinal mode (SLM) semiconductor laser device according to the present invention.
Figure 4:
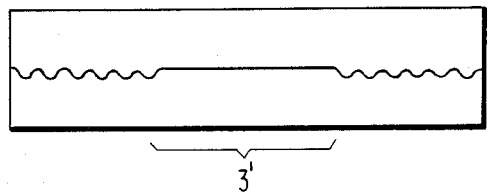
FIG. 4 is a schematic diagram of an element equivalent to the structure of FIG. 3.
Figure 5:
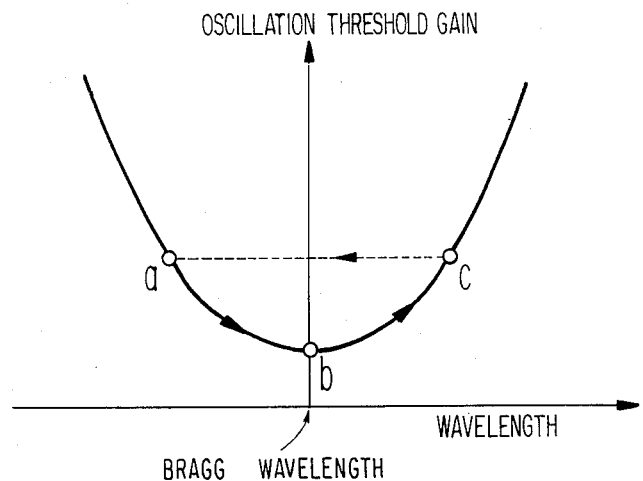
FIG. 5 shows the relationship between the oscillation threshold gain and the wavelength.

Referring to FIG. 3, which is a schematic diagram of a wavelength-tunable semiconductor laser according to the present invention, like the facet phase-tunable DFB LD described above, this semiconductor laser consists of a laser region 2 in which a diffraction grating 1 is formed, a tuning region 3, and a facet 4 of a high reflectivity. A DFB LD of this structure, by the image effect of the high reflectivity facet 4, has a double cavity length as shown in FIG. 4, and is equivalent to a DFB LD having its phase tuning region 3' in the center of the element. Such a DFB LD has already been reported on by Udaka et al., "A Study on the Oscilation Characteristics of a DFB laser Having a λ/4 Shift Grating", 1984 NATIONAL CONVENTION (RECORD) of ELECTRONICS AN COMMUNICATION ENGINEERS OF JAPAN, Vol. 4, Paper No. 1017. The relationship between the oscillation threshold gain and the wavelength here is illustrated in FIG. 5. As, in this instance, the oscillation threshold gain reaches its minimum at the Bragg wavelength (point b), there exists no stopband unlike in the conventional facet phase-tunable DFB LD. Therefore, the oscillation mode can take any wavelength between a and c on the oscillation threshold gain curve according to the phase of the phase tuning region 3'. Accordingly, the same can be said of the DFB LD illustrated in FIG. 3, so structured as to make the facet 4 at the tuning region end highly reflective, and as the quantity of phase shift of the tuning region 3 is increased, the oscillation mode shifts in the sequence of a→b→c---a on the oscillation threshold gain curve, continuous wavelength tuning being made possible between a and c. The interval between a and c is usually 10 to 20 Å in wavelength.

DETAILED DESCRIPTION OF THE PREFERRED EMBODIMENTS

Figure 6:
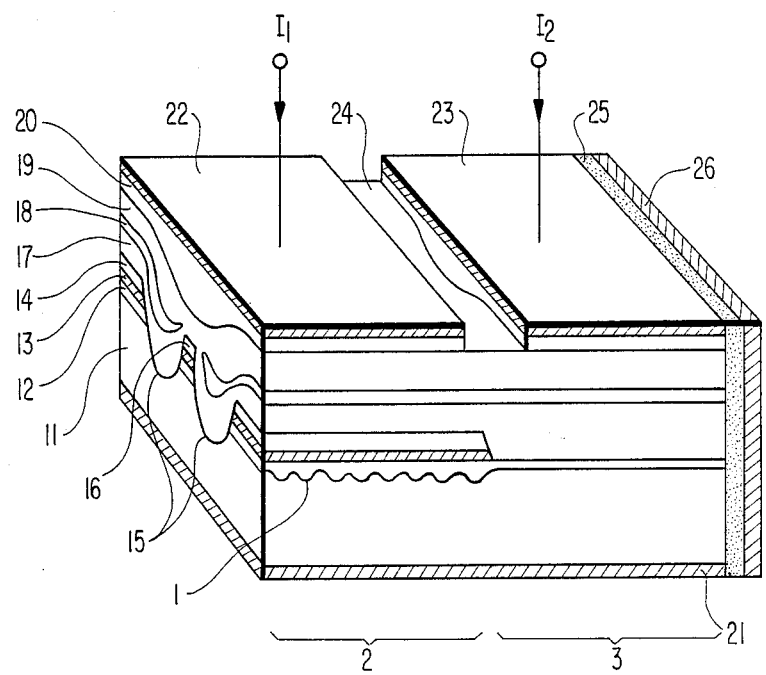
FIG. 6 shows an oblique view of an SLM semiconductor laser device which is a preferred embodiment of the present invention.

FIG. 6 illustrates the structure of a semiconductor laser, which is a preferred embodiment of the invention. This semiconductor laser primarily comprises a laser region 2, a phase tuning region 3 and a high reflectivity film 26 provided on a cleaved facet at one end of the phase tuning region 3. The laser region 2 comprises a multilayered structure consisting of an active layer 13 which emits radiation upon injection of an electric current, an optical waveguide layer 12 adjoining the active layer and having corrugation of a prescribed pitch, and a cladding layer 14 adjoining the other face of the active layer; a p-electrode 22; and an n-electrode 21. The phase tuning region 3 involves a multilayered structure which has no counterparts to the active layer and cladding layer of the laser region and whose optical waveguide layer has no corrugation, and has a p-electrode 23 and an n-electrode 21 continuous from the n-electrode of the laser region. To the p-electrode 22 is supplied a driving current $I_1$ for the laser oscillation, and to the p-electrode 23, a tuning current $I_2$ for tuning the phase of the light beam passing the phase tuning region 3 according to the refraction index in the optical waveguide layer of this region.

The fabrication process of this semiconductor laser will be described below with reference to FIGS. 7A to 7E. Referring to FIG. 7A, a diffraction grating 1 having a pitch of about 2400 Å is formed over an n-InP substrate 11 only in the part corresponding to the laser region 2, with the part corresponding to the tuning region 3 left flat. After growing an n-InGaAsP optical waveguide layer 12 of 1.3 microns in wavelength composition, an InGaAsP active layer 13 of 1.55 microns in wavelength composition and a p-InP cladding layer 14 to cover this structure all over, the part of the p-InP cladding layer 14 and the InGaAsP active layer 13 corresponding to the tuning region 3 is removed by etching to produce a wafer (FIG. 7B). In this wafer are formed two parallel channels 15 which are deeper than the InGaAsP active layer 14 to produce a mesa stripe 16 between the channels (FIG. 7C). Then are successively formed by epitaxial growth a p-InP block layer 17 and an n-InP block layer 18 except over the mesa stripe 16, and a p-InP embedding layer 19 and a p+-InGaAsP capping layer 20 all over (FIG. 7D). The approximate thicknesses of the layers are 0.2 micron for the n-InGaAsP optical waveguide layer 12, 0.1 micron for the InGaAsP active layer 13, 1 micron for the p-InP cladding layer 14, 1 micron for the p-InP block layer 17 in the flat part, 0.5 micron for the n-InP block layer 18, 2 microns for the p-InP embedding layer 19 and 1 micron for the p+-InGaAsP capping layer 20. In the stage shown in FIG. 7E, the n-electrode 21 is formed on the side of the semiconductor laser wafer produced in this manner, and on the p side are formed a driving electrode 22 and a tuning electrode 23 over the laser region 2 and the tuning region 3, respectively. To achieve adequate electric isolation between the laser region 2 and the tuning region 3, a groove 24 which is deeper than the capping layer 20 is formed between the two p-electrodes 22 and 23. On one end facet of the tuning region 3 is formed an insulating $SiO_2$ film 25 and, over it, a reflective Au film 26, resulting in a light reflectivity of 95% or even higher. By the process so far described, there can be produced the semiconductor laser illustrated in FIG. 6.

The semiconductor laser illustrated in FIG. 6 oscillates in SLM in the neighborhood of 1.55 microns in wavelength in response to the driving current $I_1$ injected into the laser region 2. If the tuning current $I_2$ is injected into the tuning region, there will occur a plasma effect to reduce the refractive index on the tuning region, and at the same time the phase on the tuning region will increase. Therefore, referring to FIG. 5, the oscillation mode varies in the sequence of a→b→c---a along with the increase of the phase on the tuning region, so that continuous wavelength tuning by the tuning current $I_2$ is made possible between a and c.

When an element of which the length of the laser region 2 was about 300 microns and that of the tuning region 3 was about 200 microns was produced, continuous wavelength tuning in an approximately 15 Å width was successfully achieved with a 30 mA tuning current $I_2$ in the vicinity of 1.55 microns in oscillation wavelength.

Although InP/InGaAsP is used as semiconductor material in this preferred embodiment, the suitable semiconductor material is not limited to it, but may as well be GaAs/AlGaAs or the like.

Further, though this embodiment uses the 1.55 micron band for oscillation wavelength, the suitable oscillation wavelength is not confined to it. If the oscillation wavelength is in, for instance, the 1.3 micron band, the pitch of the diffraction grating 1 can be selected at about 2000 Å, the wavelength composition of the n-InGaAsP optical waveguide layer 12 at 1.1 microns and that of the InGaAsP active layer at 1.3 microns.

Still further, though the optical waveguide layer 12 is under the active layer 13 in this embodiment, the former may as well be over the latter, and in that case the diffraction grating 1 may be formed over the optical waveguide layer 12. In this embodiment, the active layer 13 is not formed on the tuning region, but it may as well be on that side.

Although, in this embodiment, the $SiO_2$ insulating film 25 and, over it, the Au film 26 are formed to increase the reflectivity of the end facet on the tuning region, these films may consist of some other materials, for instance the insulating film 25 of SiN or Si and the reflective film 26 of Al or some other metal. The high reflectivity facet may consist as well of a dielectric multilayered film, such as an SiN film and an Si film.

Assessment of the effect of the reflectivity of the tuning region end facet on the wavelength tunability revealed that, at a reflectivity of 30 to 50%, continuous wavelength tuning, though not totally impossible, was rather unstable and susceptible to mode jumps. In contrast, steady wavelength tunability was achieved at a reflectivity of above 50%, and therefore it is desirable to give the end facet on the tuning region a reflectivity of more than 50%.

Further, though the groove 24 which is deeper than the p+-InGaAsP capping layer 20 is provided between the driving electrode 22 and the tuning electrode 23 to improve electric isolation between the two electrodes, instead a p-n inverting layer, for example, may be formed there by ion implantation.

FIG. 8 shows a plan of a monolithically integrated local oscillator involving a semiconductor laser of the above described structure. Over a semiconductor substrate 100 are formed a DFB LD 200 having a wavelength tuning mechanism, a photodiode 300 and an optical waveguide 400. A signal light beam 600 coming incident from the input port 500 of the optical waveguide 400 is mixed with another light beam from the DFB LD 200, which is a local oscillator, and the mixed light beam is received by the photodiode 300. The DFB LD 200 consists of a DFB region (active region) 2 and a wavelength tuning region 3. The DFB LD 200 can alter its oscillation wavelength by the change of a tuning current in the region 3. Therefore, pursuing the wavelength variation of the signal light beam 600, the local oscillator allows the intermediate frequency of the receiving system to be kept constant. Such an element can be produced by performing three LPE growth processes—crystal growth over the diffraction grating for the DFB LD, that of the optical waveguide layer and the tuning region layer, and that for overall embedding.

Figure 9:
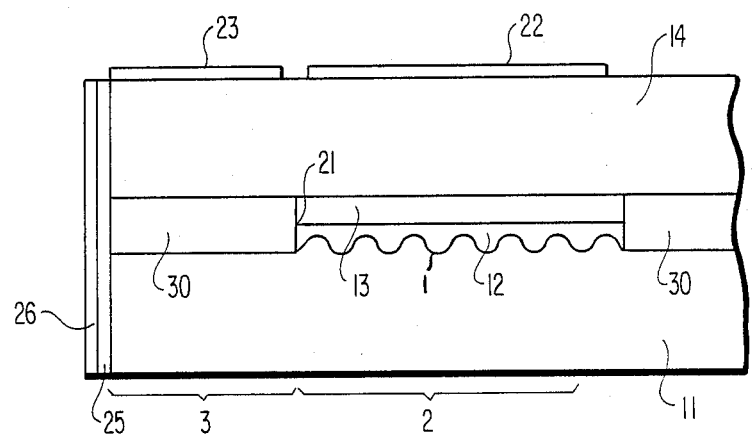
FIG. 9 shows a cross section of a DFB LD along line 9A—9A' in FIG. 8.

FIG. 9 shows a section, in the direction of the laser cavity axis, of the local oscillator in the vicinity of the DFB LD 200. Over an InP substrate 11 is formed a diffraction grating 1, over which are first accumulated, for instance, an InGaAsP waveguide layer 12 corresponding to a wavelength composition of 1.3 microns, an InGaAsP active layer 13 corresponding to a wavelength composition of 1.55 microns, a cladding layer 14 and so on. After partially removing the active layer 13 by etching, an optical waveguide layer 30 and the cladding layer 14 are selectively grown. After that, a DFB electrode 22, a tuning electrode 23, an SiO film 25 and an Au film 26 are formed to produce the wavelength tunable DFB LD 200.

As so far described, in this preferred embodiment of the present invention, it is made possible to keep the intermediate frequency of the receiving system all the time by the use of a DFB LD permitting the tuning of oscillation wavelength in a monolithically integrated local oscillator for optical heterodyne detection.

In the SLM semiconductor laser, continuous wavelength tuning has been successfully achieved in a width of about 15 Å in terms of wavelength. This laser has proved applicable to the local oscillator of the optical heterodyne system or the like. It is also expected to find successful application to the light source for wavelength multiplex transmission, frequency modulated transmission and so forth.

What is claimed is:

1. A semiconductor laser device comprising:
   a semiconductor substrate;
   a laser region including an active layer formed over said semiconductor substrate for emitting radiation when excited, an optical waveguide layer formed below said active layer and having a band-gap greater than said active layer for waveguiding the radiation therein, a diffraction grating provided along said optical waveguide layer for coupling the radiation, and first electrode means formed over said active layer for feeding an injection current to said laser region to excite said active layer;
   a tuning region formed over said semiconductor substrate including an optical waveguide layer extending from said optical waveguide layer of said laser region for waveguiding and constituting a part of the laser oscillation light path, and second electrode means formed over said optical waveguide layer of said tuning region for injecting an electric current across said optical waveguide layer of said tuning region; and
   reflective means formed on a vertical end facet of said optical waveguide layer of said tuning region for providing a reflectivity of 50% or above;
   wherein said active region does not extend into said tuning region, no diffraction grating is provided along the optical waveguide layer of said tuning region, and the oscillation wavelength of said laser device is tuned by changing the electric current injected into said tuning region.

2. An integrated optical local oscillator comprising:
   (a) a semiconductor substrate;
   (b) a semiconductor laser device formed on said substrate, said laser device comprising;
   a laser region including an active layer formed over said semiconductor substrate for emitting radiation when excited, an optical waveguide layer formed below said active layer and having a bandgap greater than said active layer for waveguiding the radiation therein, a diffraction grating provided along said optical waveguide layer for coupling the radiation, and first electrode means formed over said active layer for feeding an injection current to said laser region to excite said active layer,
   a tuning region formed over said semiconductor substrate including an optical waveguide layer extending from said optical waveguide layer of said laser region for waveguiding and constituting a part of the laser oscillation light path, and second electrode means formed over said optical waveguide layer of said tuning region for injecting an electric current across said optical waveguide layer of said tuning region, and
   reflective means formed on a vertical end facet of said optical waveguide layer of said tuning region for providing a reflectivity of 50% or above,
   wherein sasid active region does not extend into said tuning region, no diffraction grating is provided along the optical waveguide layer of said tuning region, and the oscillation wavelength of said laser device is tuned by changing the electric current injected into said tuning region;
   (c) a first optical waveguide on said substrate having first and second ends opposing to each other, said first end optically coupled to the end of said laser region remote from said tuning region;
   (d) a second optical waveguide formed on said substrate, coupled to said first optical waveguide and having an end constituting an optical input signal port; and (e) a photodiode formed on said substrate and located to couple to said second end of said first optical waveguide.

3. A semiconductor laser device as claimed in claim 1 wherein said laser region further comprises a cladding layer formed over said active and optical waveguide layers; and further comprising two parallel channels extending through said active layer of said laser region and along the length of the laser device between the laser region and tuning region to form a mesa stripe including the active region between said channels, a first block layer formed over the laser region and the tuning region, a second block layer formed over said first block layer except in the area over said mesa stripe, an embedding layer formed over said second block layer and said first block layer in the area of said mesa stripe, a capping layer formed over said embedding layer, said first and second electrode means being formed over said capping layer and separate from each other, and means between said first and second electrode means for providing electric isolation therebetween.

4. A semiconductor laser device as claimed in claim 1, wherein said reflective means is comprised of an insulating film and a metal film.

5. A semiconductor laser device as claimed in claim 4 wherein said insulating film is $SiO_2$ and said metal film is Au.

6. A semiconductor laser device as claimed in claim 4 wherein said insulating film is one of SiN and Si.

7. A semiconductor laser device as claimed in claim 4 wherein said metal film is one of Au and Al.

8. A semiconductor laser device as claimed in claim 1 wherein said reflective means is a multi-layered dielectric film.

9. A semiconductor laser device as claimed in claim 3 wherein said electric isolation means comprises a groove through said capping layer in the area between said first and second electrode means.

10. A semiconductor laser device as claimed in claim 3 wherein said electric isolation means comprises a p-n inverting layer between the first and second electrode means.

11. A semiconductor laser device comprising:
a semiconductor substrate;
a laser region including an active layer formed over said semiconductor substrate for emitting radiation when excited, an optical waveguide layer formed above said active layer and having a band-gap greater than said active layer for waveguiding the radiation therein, a diffraction grating provided along said optical waveguide layer for coupling the radiation, and first electrode means formed over said optical waveguide layer for feeding an injection current to said laser region to excite said active layer;
a tuning region formed over said semiconductor substrate including an optical waveguide layer extending from said optical waveguide layer of said laser region for waveguiding and constituting a part of the laser oscillation light path, and second electrode means formed over said optical waveguide layer of said tuning region for injecting an electric current across said optical waveguide layer of said tuning region; and
reflective means formed on a vertical end facet of said optical waveguide layer of said tuning region for providing a reflectivity of 50% or above;
wherein said active region does not extend into said turning region, no diffraction grating is provided along the optical waveguide layer of said tuning region, and the oscillation wavelength of said laser device is tuned by changing the electric current injected into said tuning region.

12. An integrated optical local oscillator comprising:
(a) a semiconductor substrate;
(b) a semiconductor laser device formed on said substrate, said laser device comprising,
a laser region incluidng an active layer formed over said semiconductor substrate for emitting radiation when excited, an optical waveguide layer formed above said active layer and having a bandgap greater than said active layer for waveguiding the radiation therein, a diffraction grating provided along said optical waveguide layer for coupling the radiation, and first electrode means formed over said optical waveguide layer for feeding an injection current to said laser region to excite said active layer,
a tuning region formed over said semiconductor substrate including an optical waveguide layer extending from said optical waveguide layer of said laser region for waveguiding and constituting a part of the laser oscillation light path, and second electrode means formed over said optical waveguide layer of said tuning region for injecting an electric current across said optical waveguide layer of said tuning region, and
reflective means formed on a vertical end facet of said optical waveguide layer of said tuning region for providing a reflectivity of 50% or above,
wherein said active region does not extend into said turning region, no diffraction grating is provided along the optical waveguide layer of said tuning region, and the oscillation wavelength of said laser device is turned by changing the electric current injected into said tuning region;
(c) a first optical waveguide on said substrate having first and second ends opposing to each other, said first end optically coupled to the end of said laser region remote from said tuning region;
(d) a second optical waveguide formed on said substrate, coupled to said first optical waveguide and having an end constituting an optical input signal port; and
(e) a photodiode formed on said substrate and located to coupled to said second end of said first optical waveguide.

* * * * *

UNITED STATES PATENT AND TRADEMARK OFFICE
CERTIFICATE OF CORRECTION

PATENT NO. : 4,751,710
DATED : June 14, 1988
INVENTOR(S) : Yamaguchi et al

It is certified that error appears in the above-identified patent and that said Letters Patent is hereby corrected as shown below:

| | |
|---|---|
| COLUMN 2, LINE 34 | Delete "schematio" insert --schematic-- |
| COLUMN 3, LINE 11 | Delete "(point b)" insert --(point $\underline{b}$)-- |
| COLUMN 3, LINE 14 | Delete "a and c" insert --$\underline{a}$ and $\underline{c}$-- |
| COLUMN 3, LINE 21 | Delete "a→b→c--→a" and insert --$\underline{a}$→$\underline{b}$→$\underline{c}$--→$\underline{a}$-- |
| COLUMN 3, LINE 23 | Delete both instances of "a and c" and insert --$\underline{a}$ and $\underline{c}$-- |
| COLUMN 4, LINE 12 | Before "side" insert --$\underline{n}$-- |
| COLUMN 4, LINE 13 | Delete "p" insert --$\underline{p}$-- |
| COLUMN 4, LINE 33 | Delete "a→b→c--→a" and insert --$\underline{a}$→$\underline{b}$→$\underline{c}$--→$\underline{a}$-- |
| COLUMN 4, LINE 36 | Delete "a and c" insert --$\underline{a}$ and $\underline{c}$-- |
| COLUMN 5, LINE 62 | Delete "A" insert --Å-- |
| COLUMN 6, LINE 57 | Delete "sasid" insert --said--; |

UNITED STATES PATENT AND TRADEMARK OFFICE
CERTIFICATE OF CORRECTION

PATENT NO. : 4,751,710
DATED : June 14, 1988
INVENTOR(S) : Yamaguchi et al

Page 2 of 2

It is certified that error appears in the above-identified patent and that said Letters Patent is hereby corrected as shown below:

COLUMN 8, LINE 20   Delete "incluidng" insert --including--.

Signed and Sealed this

Twenty-second Day of November, 1988

Attest:

DONALD J. QUIGG

Attesting Officer

Commissioner of Patents and Trademarks